(12) United States Patent
Jordan et al.

(10) Patent No.: US 8,829,991 B2
(45) Date of Patent: Sep. 9, 2014

(54) DC OFFSET TRACKING CIRCUIT

(75) Inventors: Andrew M. Jordan, Scarborough, ME (US); Hrvoje Jasa, Scarborough, ME (US)

(73) Assignee: Fairchild Semiconductor Corporation, San Jose, CA (US)

(*) Notice: Subject to any disclaimer, the term of this patent is extended or adjusted under 35 U.S.C. 154(b) by 15 days.

(21) Appl. No.: 13/350,244

(22) Filed: Jan. 13, 2012

(65) Prior Publication Data

US 2012/0182068 A1 Jul. 19, 2012

Related U.S. Application Data

(60) Provisional application No. 61/432,754, filed on Jan. 14, 2011.

(51) Int. Cl.
*H03F 3/45* (2006.01)

(52) U.S. Cl.
USPC ............................................. 330/69; 330/252

(58) Field of Classification Search
CPC .......................................................... H03F 3/45
USPC ................................. 330/69, 252, 9, 260, 261
See application file for complete search history.

(56) References Cited

U.S. PATENT DOCUMENTS

| | | | |
|---|---|---|---|
| 3,512,100 A | 5/1970 | Killion et al. | |
| 3,629,719 A * | 12/1971 | Heller et al. | ............ 330/69 |
| 5,097,224 A | 3/1992 | Madaffari et al. | |
| 5,557,239 A | 9/1996 | Masao | |
| 5,587,857 A | 12/1996 | Voldman et al. | |
| 5,777,829 A | 7/1998 | Voldman et al. | |
| 6,104,048 A | 8/2000 | Wang et al. | |
| 6,353,344 B1 | 3/2002 | Lafort | |
| 6,710,983 B2 | 3/2004 | Voldman | |
| 6,812,788 B2 | 11/2004 | Kern | |
| 6,891,702 B1 | 5/2005 | Tang | |
| 6,972,930 B1 | 12/2005 | Tang et al. | |
| 7,149,317 B2 | 12/2006 | Lafort | |
| 7,394,638 B2 | 7/2008 | Ahmad et al. | |

(Continued)

FOREIGN PATENT DOCUMENTS

| CN | 1189011 A | 7/1998 |
|---|---|---|
| CN | 1244983 C | 3/2006 |

(Continued)

OTHER PUBLICATIONS

"U.S. Appl. No. 12/874,832, Non Final Office Action mailed Jun. 18, 2012", 16 pgs.

(Continued)

*Primary Examiner* — Henry Choe
(74) *Attorney, Agent, or Firm* — Schwegman, Lundberg & Woessner, P.A.

(57) ABSTRACT

This document discusses, among other things, an amplifier circuit including first and second amplifiers configured to receive an input signal and to provide a differential output signal using a feedback loop including a transconductance amplifier. A non-inverting input of a first amplifier can be configured to receive an input signal. The feedback loop can be configured to receive the outputs from the first and second amplifiers and to provide a feedback signal to the non-inverting input of the second amplifier, for example, to reduce a DC offset error or to increase a dynamic range of the amplifier circuit.

21 Claims, 3 Drawing Sheets

(56) References Cited

U.S. PATENT DOCUMENTS

| | | | |
|---|---|---|---|
| 7,489,482 B2 | 2/2009 | Ono et al. | |
| 7,605,569 B2 | 10/2009 | Kaltenegger et al. | |
| 7,634,096 B2 | 12/2009 | Fallesen | |
| 8,026,759 B2 * | 9/2011 | Choi et al. | 330/9 |
| 8,067,980 B2 | 11/2011 | Berkhout et al. | |
| 8,139,790 B2 | 3/2012 | Wu | |
| 8,400,214 B2 * | 3/2013 | Draxelmayr | 330/69 |
| 8,536,924 B2 | 9/2013 | Jordan et al. | |
| 2003/0169115 A1 | 9/2003 | Lee et al. | |
| 2003/0206054 A1 | 11/2003 | Jin et al. | |
| 2012/0056668 A1 | 3/2012 | Jordan et al. | |

FOREIGN PATENT DOCUMENTS

| | | |
|---|---|---|
| CN | 102386875 A | 3/2012 |
| CN | 102594273 A | 7/2012 |
| CN | 202696550 U | 1/2013 |
| KR | 1020080071450 A | 8/2008 |
| KR | 1020120023579 A | 3/2012 |
| KR | 1020120082848 A | 7/2012 |

OTHER PUBLICATIONS

"Chinese Application Serial No. 201220019029.0, Office Action mailed Jun. 27, 2012", 3 pgs.

"U.S. Appl. No. 12/874,832, Advisory Action mailed Mar. 13, 2012", 8 pgs.

"U.S. Appl. No. 12/874,832, Examiner Interview Summary mailed May 8, 2013", 3 pgs.

"U.S. Appl. No. 12/874,832, Final Office Action mailed Jan. 4, 2013", 10 pgs.

"U.S. Appl. No. 12/874,832, Notice of Allowance mailed May 17, 2013", 8 pgs.

"U.S. Appl. No. 12/874,832, PTO Response to Rule 312 Communication mailed Aug. 6, 2013", 1 pg.

"U.S. Appl. No. 12/874,832, Response filed Mar. 4, 2013 to Final Office Action mailed Jan. 4, 2013", 11 pgs.

"U.S. Appl. No. 12/874,832, Response filed May 6, 2013 to Advisory Action mailed Mar. 13, 2013", 9 pgs.

"U.S. Appl. No. 12/874,832, Response filed Nov. 16, 2012 to Non Final Office Action mailed Jun. 18, 2012", 20 pgs.

"Chinese Application Serial No. 201220019029.0, Response filed Sep. 12, 2012 to Office Action mailed Jun. 27, 2012", 23 pgs.

"Chinese Application Serial No. 201210012702.2, Office Action mailed Jun. 3, 2014", 9 pgs.

Mak, et al., "On the Design of Programmable-Gain Amplifier With Built-Compact DC-Offset Cancellers for Very Low-Voltage WLAN Systems", IEEE Transaction 20080331 on circuits and systems, 496-509.

Thomas, Degen, et al., "A Pseudodifferential Amplifier for Bioelectric Events With DC-Compensation Two-Wired Amplifying Elecrodes", IEEE Transactions 20060301 on Biomedical Engineering, 300-310.

* cited by examiner

DC OFFSET TRACKING CIRCUIT

CLAIM OF PRIORITY

This application claims the benefit of priority under 35 U.S.C. §119(e) to Jordan et al., U.S. Patent Application Ser. No. 61/432,754, entitled "DC OFFSET TRACKING CIRCUIT," filed on Jan. 14, 2011, which is hereby are incorporated by reference herein in its entirety.

BACKGROUND

Generally, sensor circuits receive electrical signals from a transducer. The sensor circuit then amplifies the received signals to a desired level for processing. In some sensor circuits, the signal is biased and amplified to provide a differential output. Noise on power supplies, such as noise on a common mode power supply used to bias the signal, can interfere with the reception and amplification of received sensor signals. In some sensor circuits, filters are used to pass signals having certain frequencies of interest. Providing traditional filters in combination with or in proximity to power supplies or other circuits on an integrated circuit chip can limit the quality of signal processing of the filter due to distortion caused by the power supply or other circuits, as well as limit the ability of the filter to provide low frequency poles.

OVERVIEW

In certain examples, an amplifier circuit can include first and second amplifiers configured to receive an input signal and to provide a differential output signal using a feedback loop including a transconductance amplifier. A non-inverting input of a first amplifier can be configured to receive an input signal. The feedback loop can be configured to receive the outputs from the first and second amplifiers and to provide a feedback signal to the non-inverting input of the second amplifier, for example, to reduce a DC offset error or to increase a dynamic range of the amplifier circuit. In certain examples, the feedback loop can include the transconductance amplifier coupled between the output of the first and second amplifiers and the non-inverting input of the second amplifier and a capacitor coupled between the non-inverting input of the second amplifier and ground.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, a system and method for eliminating DC offset error in an amplifier, for example, used in signal path digital microphones, or one or more other amplifier application. In an example, the DC value at an input of an amplifier can be used to bias a circuit such that only the signals in a passband are amplified. Accordingly, the DC value of the signal is not amplified, allowing larger dynamic range for circuits operating in low power supply applications.

Certain circuits require a high value of input impedance (e.g., in the range of 1-100 GΩ). Circuits that generate this value of impedance can be sensitive to loading, which can cause a shift in operating voltage. In an example, the shift in operating voltage can be sensed, and the shift can be corrected to allow the circuit to operate with good tolerance to external loading (e.g., leakage).

Figure 1:
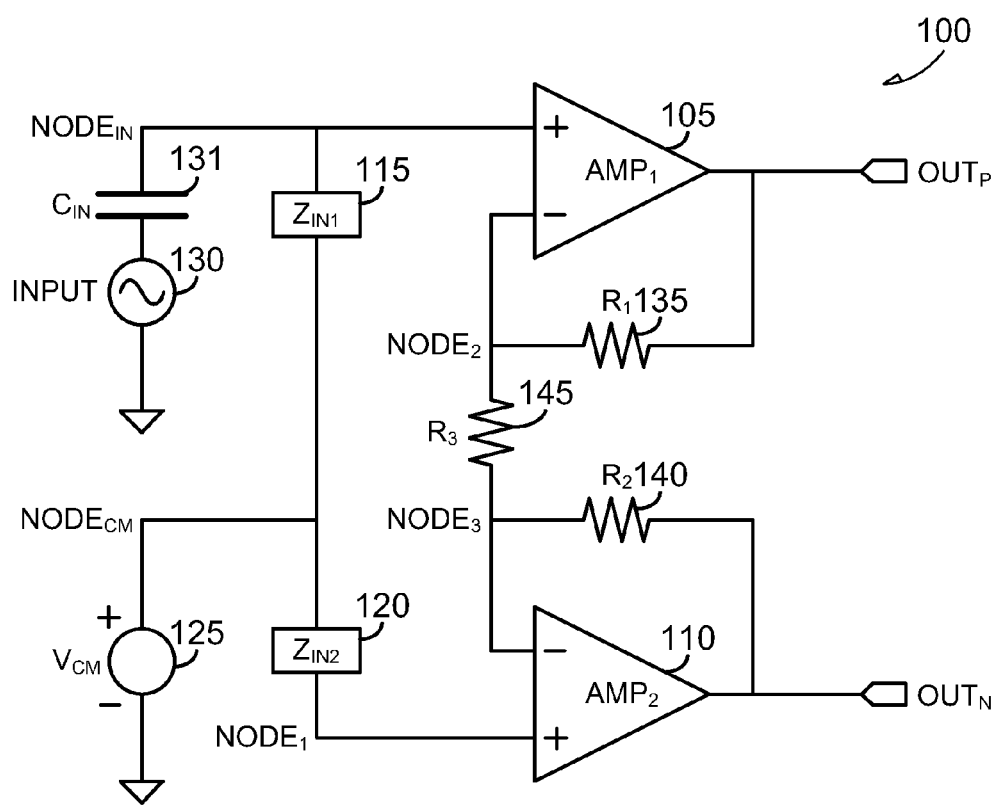
FIGS. 1-2 illustrate generally examples of single-ended to differential amplifier circuits including first and second amplifiers (AMP$_1$, AMP$_2$) and an input bias network ($Z_{IN1}$, $Z_{IN2}$) configured to bias the DC levels of the first and second amplifiers at a common mode voltage ($V_{CM}$).

FIG. 1 illustrates generally an example of a single-ended to differential amplifier circuit 100 including first and second amplifiers (AMP$_1$, AMP$_2$) 105, 110, an input bias network (e.g., first and second input bias networks ($Z_{IN1}$, $Z_{IN2}$) 115, 120), and first, second, and third resistors (R1, R2, R3) 135, 140, 145. The circuit 100 can be configured to receive an input from a single-ended source (INPUT) 130, to receive a common mode voltage from a common mode supply ($V_{CM}$) 125, and to provide a differential output between positive and negative output nodes (OUT$_P$, OUT$_N$). In an example, the single-ended source 130 can include an associated input capacitance ($C_{IN}$) 131. In an example, the input bias network can be configured to bias the DC levels of the first and second amplifiers 105, 110 at a common mode voltage ($V_{CM}$) 125.

In an example, the input bias network can be conceptualized as very high value resistors. The transfer function of the circuit 100 can be written as:

$$V_{OUTp} - V_{OUTn} = (V_{NODEin} - V_{NODE1}) * \left( \left(1 + \frac{R_1}{R_3}\right) + \frac{R_2}{R_3} \right) \quad \text{(Eq. 1)}$$

$$\text{where, } V_{NODE1} = V_{CM} \quad \text{(Eq. 2)}$$

In an example, during manufacture of the circuit 100, the input node (NODE$_{IN}$) can potentially receive a parasitic resistance that can cause the input bias network to supply current.

In an example, the input bias network can include an input bias network or high-impedance network such as that described in the commonly assigned Thomson et al. U.S. patent application Ser. No. 12/874,832, which is herein incorporated by reference in its entirety, including its description of using one or more high-impedance networks with a single-ended to differential amplifier.

Figure 2:
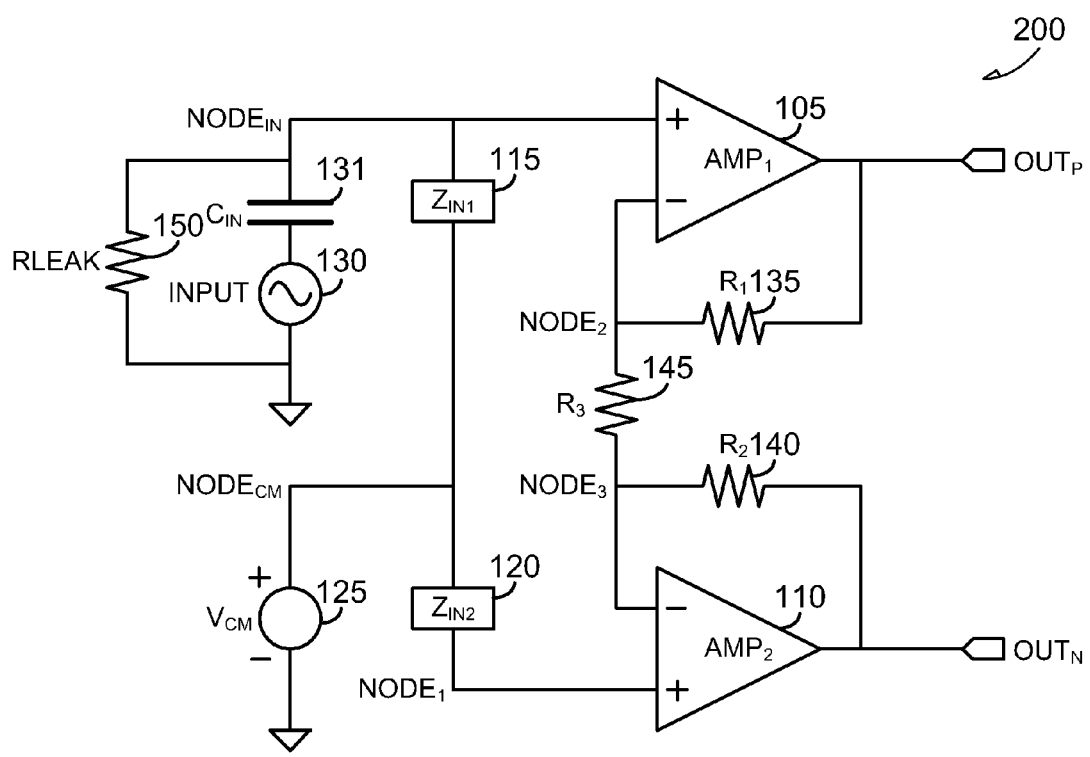

FIG. 2 illustrates generally an example of a single-ended to differential amplifier circuit 200, such as that illustrated in FIG. 1, additionally including a parasitic resistance ($R_{LEAK}$) 150 from an input node (NODE$_{IN}$).

For example, if $V_{CM}$ 125 has a value of 0.75V, and the parasitic resistance 150 has a value of 50 GΩ, the input bias network must supply 12.5 pA. If the input bias network were such that it synthesized 10 GΩ, then the DC level of NODE$_{IN}$ would have to shift by 125 mV. Under this condition, a first node (NODE$_1$) can be at DC bias $V_{CM}$, and NODE$_{IN}$ can be at $V_{CM}$-125 mV. The output ($V_{OUTp}$, $V_{OUTn}$) of the first and second amplifiers 105, 110, (e.g., the voltage at output nodes OUT$_P$, OUT$_N$) can be written, assuming a differential gain of 5, as:

$$V_{OUTp} = V_{CM} - 0.125 * \left(1 + \frac{R_1}{R_3}\right) = V_{CM} - 0.3125 \qquad \text{(Eq. 3)}$$

$$V_{OUTn} = V_{CM} + 0.125 * \frac{R_2}{R_3} = V_{CM} + 0.3125 \qquad \text{(Eq. 4)}$$

$$\text{where,} \left(1 + \frac{R_1}{R_3}\right) = \frac{R_2}{R_3} = 2.5 \qquad \text{(Eq. 5)}$$

$$V_{OUTp} - V_{OUTn} = -0.625 \qquad \text{(Eq. 6)}$$

Here, the effect of the parasitic resistance 150 can cause the circuit 200 to produce a negative output, −0.625V, even when no input signal is present. If the circuit 200 operates within a ±1.2V dynamic range, 52% of that range, or more in certain examples, can be lost due to this offset. The present inventors have recognized, among other things, systems and methods to remove the effects of the parasitic resistance 150, illustrated above.

Figure 3:
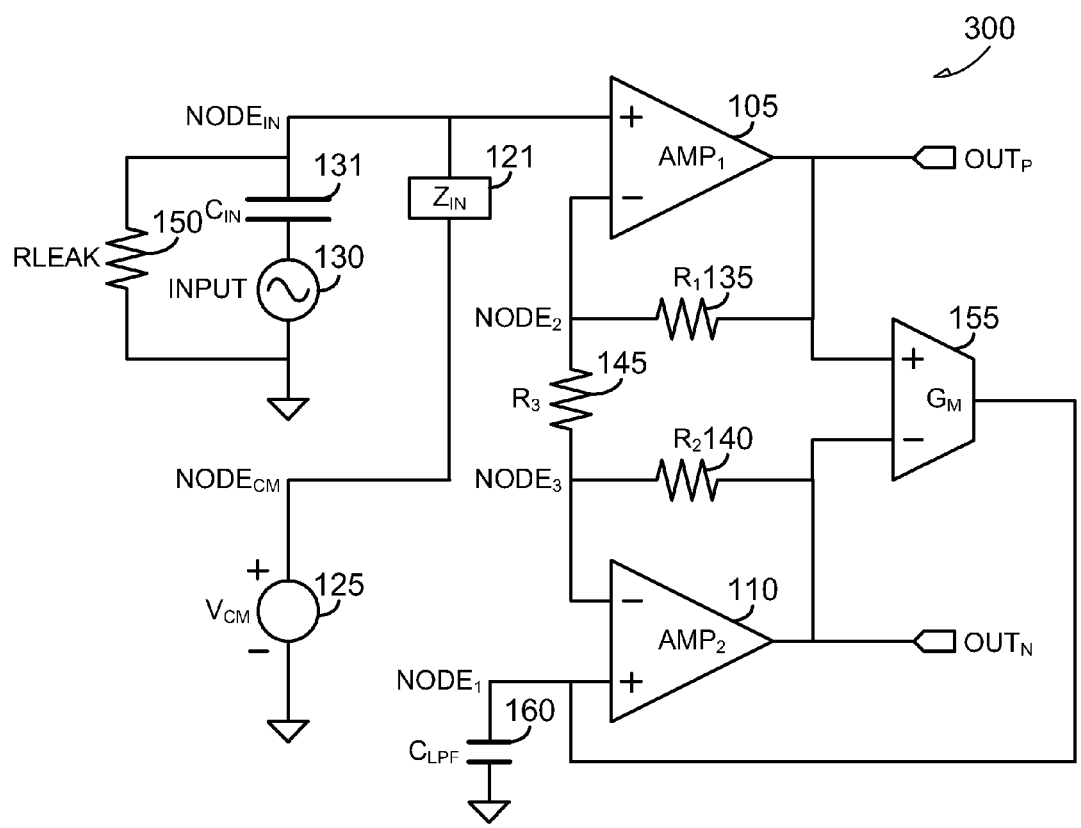
FIG. 3 illustrates generally an example of a single-ended to differential amplifier circuit including first and second amplifiers (AMP$_1$, AMP$_2$), an input bias network ($Z_{CM}$, $Z_{IN2}$), a transconductance ($G_M$) amplifier, and a capacitor ($C_{LPF}$).

FIG. 3 illustrates generally an example of a single-ended to differential amplifier circuit 300 including first and second amplifiers (AMP$_1$, AMP$_2$) 105, 110, an input bias network (Z$_{IN}$) 221, first, second, and third resistors (R1, R2, R3) 135, 140, 145, a transconductance (G$_M$) amplifier 155, and a capacitor (C$_{LPF}$) 160.

In the example of FIG. 3, and in contrast to that illustrated in FIGS. 1-2, the output of the first and second amplifiers 105, 110 can be fed into the transconductance amplifier 155 and the capacitor 160, together referred to as a "G$_M$C block" or a feedback loop, which form the following transfer function:

$$V_{OUTn}(s) = (V_+ - V_-) * \frac{G_M}{sC_{LPF}} \qquad \text{(Eq. 7)}$$

$$\text{where,} \ \omega_{TI} = \frac{G_M}{C_{LPF}} \qquad \text{(Eq. 8)}$$

The cross over frequency, $\omega_{TI}$ is the point where the gain goes below zero. By choosing the values correctly, the G$_M$C block can low pass filter the output of the first and second amplifiers 105, 110 and provide a feedback loop from the output of the first and second amplifiers to the non-inverting input of the second amplifier 110. In an example, the loop including the G$_M$C block can drive NODE$_1$ until the input of the transconductance amplifier 155 has zero difference within the low pass response of the filter. With no signal applied, but the parasitic resistance 150 present, the loop can only be satisfied when NODE$_1$=NODE$_{IN}$. In certain examples, when a signal is applied, the G$_M$C block can ignore frequencies above the filter corner and only servo the loop from a DC perspective.

Here, as in the example illustrated in FIG. 2, NODE$_{IN}$ is V$_{CM}$−125 mV. The loop of the G$_M$C block can drive NODE$_1$ to V$_{CM}$−100 mV. Although 125 mV of the input dynamic range has been lost, range at the output of the amplifiers has been gained, as there will no longer be a static offset. In the example illustrated in FIG. 3, the input dynamic range has dropped from ±0.75V to ±0.625V, or −16%, wherein previous examples, including the example illustrated in FIG. 2, realized drops in dynamic range of greater than 50%. Further, in the example of FIG. 3, the circuit 300 will stabilize regardless of the value of the parasitic resistance 150.

Additional Notes

In Example 1, an amplifier circuit configured to receive an input signal and to provide a differential output signal includes first and second amplifiers, each including an inverting input, a non-inverting input, and an output, and a feedback loop coupled between the outputs of the first and second amplifiers and the non-inverting input of the second amplifier, the feedback loop including a transconductance amplifier, wherein the non-inverting input of the first amplifier is configured to receive the input signal, and wherein the outputs of the first and second amplifiers are configured to provide the differential output signal, and the feedback loop is configured to receive the outputs from the first and second amplifiers and to provide a feedback signal to the non-inverting input of the second amplifier.

In Example 2, the feedback loop of Example 1 is optionally configured to provide the feedback signal to the non-inverting input of the second amplifier to reduce a DC offset error and to increase a dynamic range of the amplifier circuit.

In Example 3, the amplifier circuit of any one or more of Examples 1-2 optionally includes a single-ended to differential amplifier circuit, wherein the input signal of any one or more of Examples 1-2 optionally includes a single-ended input signal.

In Example 4, any one or more of Examples 1-3 optionally includes a single-ended source coupled to the non-inverting input of the first amplifier.

In Example 5, any one or more of Examples 1-4 optionally includes an input bias network, wherein the non-inverting input of the first amplifier of any one or more of Examples 1-4 is optionally configured to receive a common mode voltage through the input bias network.

In Example 6, any one or more of Examples 1-5 optionally includes a common mode supply coupled to the first amplifier through the input bias network.

In Example 7, the inverting input of the first amplifier of any one or more of Examples 1-6 is optionally coupled to the output of the first amplifier through a first impedance, the inverting input of the second amplifier of any one or more of Examples 1-6 is optionally coupled to the output of the second amplifier through a second impedance, and the inverting input of the first amplifiers of any one or more of Examples 1-6 is optionally coupled to the inverting input of the second amplifier through a third impedance.

In Example 8, the transconductance amplifier of any one or more of Examples 1-7 optionally includes an inverting input, a non-inverting input, and an output, wherein the output of the transconductance amplifier of any one or more of Examples 1-7 is optionally coupled to the non-inverting input of the second amplifier.

In Example 9, the feedback loop of any one or more of Examples 1-8 optionally includes a capacitor coupled to the non-inverting input of the second amplifier and coupled to the output of the transconductance amplifier.

In Example 10, the feedback loop of any one or more of Examples 1-9 optionally includes a capacitor coupled between the non-inverting input of the second amplifier and ground.

In Example 11, any one or more of Examples 1-10 optionally includes an integrated circuit, the integrated circuit including the first and second amplifiers and the feedback loop.

In Example 12, the non-inverting input of the transconductance amplifier of any one or more of Examples 1-11 is optionally configured to receive the output of the first amplifier, wherein the inverting input of the transconductance amplifier of any one or more of Examples 1-11 is optionally configured to receive the output of the second amplifier.

In Example 13, any one or more of Examples 1-12 optionally includes an integrated circuit, the integrated circuit including the first and second amplifiers and the transconductance amplifier.

In Example 14, an amplifying method includes receiving an input signal at a non-inverting input of a first amplifier of an amplifier circuit, receiving an output of a second amplifier of the amplifier circuit and the output of the first amplifier at a feedback loop, the feedback loop including a transconductance amplifier, providing a feedback signal to the non-inverting input of the second amplifier using the transconductance amplifier, and providing a differential output signal at the outputs of the first and second amplifiers.

In Example 15, the providing the feedback signal of any one or more of Examples 1-14 optionally includes to reduce a DC offset error and to increase a dynamic range of the amplifier circuit.

In Example 16, the amplifier circuit of any one or more of Examples 1-15 optionally includes a single-ended to differential amplifier circuit, wherein the input signal of any one or more of Examples 1-15 optionally includes a single-ended input signal.

In Example 17, any one or more of Examples 1-16 optionally includes receiving a common mode voltage at the non-inverting input of the first amplifier through an input bias network.

In Example 18, any one or more of Examples 1-17 optionally includes coupling an inverting input of the first amplifier to the output of the first amplifier using a first impedance, coupling an inverting input of the second amplifier to the output of the second amplifier using a second impedance, and coupling the inverting input of the first amplifier to the inverting input of the second amplifier using a third impedance.

In Example 19, any one or more of Examples 1-18 optionally includes receiving the outputs of the first and second amplifiers at first and second inputs of the transconductance amplifier and providing the output of the transconductance amplifier to the non-inverting input of the second amplifier.

In Example 20, any one or more of Examples 1-19 optionally includes coupling a capacitor between the non-inverting input of the second amplifier and ground, wherein the feedback loop of any one or more of Examples 1-19 optionally includes the capacitor.

In Example 21, a single-ended to differential amplifier circuit configured to receive a single-ended input signal and to provide a differential output signal includes first and second amplifiers, each including an inverting input, a non-inverting input, and an output, a feedback loop coupled between the outputs of the first and second amplifiers and the non-inverting input of the second amplifier, and an input bias network. The feedback loop includes a transconductance amplifier and a capacitor. The non-inverting input of the first amplifier is configured to receive the input signal and to receive a common mode voltage through the input bias network. The outputs of the first and second amplifiers are configured to provide the differential output signal. The inverting input of the first amplifier is coupled to the output of the first amplifier through a first impedance, the inverting input of the second amplifier is coupled to the output of the second amplifier through a second impedance, and the inverting input of the first amplifiers is coupled to the inverting input of the second amplifier through a third impedance. The feedback loop is configured to receive the outputs from the first and second amplifiers and to provide a feedback signal to the non-inverting input of the second amplifier to reduce a DC offset error and to increase a dynamic range of the single-ended to differential amplifier circuit. The non-inverting input of the transconductance amplifier is configured to receive the output of the first amplifier, the inverting input of the transconductance amplifier is configured to receive the output of the second amplifier, and the output of the transconductance amplifier is coupled to the non-inverting input of the second amplifier.

In Example 22, a system or apparatus can include, or can optionally be combined with any portion or combination of any portions of any one or more of Examples 1-20 to include, means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, although the examples above have been described relating to PNP devices, one or more examples can be applicable to NPN devices. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An amplifier circuit configured to receive an input signal and to provide a differential output signal, the amplifier circuit comprising:
   first and second amplifiers, each including an inverting input, a non-inverting input, and an output;
   a feedback loop coupled between the outputs of the first and second amplifiers and the non-inverting input of the second amplifier, the feedback loop including a transconductance amplifier configured to receive a differential input voltage and to provide a feedback current;
   wherein the non-inverting input of the first amplifier is configured to receive the input signal, and wherein the outputs of the first and second amplifiers are configured to provide the differential output signal; and
   wherein the feedback loop is configured to receive the outputs from the first and second amplifiers and to provide a feedback signal to the non-inverting input of the second amplifier.

2. The amplifier circuit of claim 1, wherein the feedback loop is configured to provide the feedback signal to the non-inverting input of the second amplifier to reduce a DC offset error and to increase a dynamic range of the amplifier circuit.

3. The amplifier circuit of claim 1, wherein the amplifier circuit includes a single-ended to differential amplifier circuit; and
   wherein the input signal includes a single-ended input signal.

4. The amplifier circuit of claim 3, including a single-ended source coupled to the non-inverting input of the first amplifier.

5. The amplifier circuit of claim 1, including:
   an input bias network; and
   wherein the non-inverting input of the first amplifier is configured to receive a common mode voltage through the input bias network.

6. The amplifier circuit of claim 5, including a common mode supply coupled to the first amplifier through the input bias network.

7. The amplifier circuit of claim 1, wherein the inverting input of the first amplifier is coupled to the output of the first amplifier through a first impedance;
   wherein the inverting input of the second amplifier is coupled to the output of the second amplifier through a second impedance; and
   wherein the inverting input of the first amplifiers is coupled to the inverting input of the second amplifier through a third impedance.

8. The amplifier circuit of claim 1, wherein the transconductance amplifier includes an inverting input, a non-inverting input, and an output; and
   wherein the output of the transconductance amplifier is coupled to the non-inverting input of the second amplifier.

9. The amplifier circuit of claim 8, wherein the feedback loop includes a capacitor coupled to the non-inverting input of the second amplifier and coupled to the output of the transconductance amplifier.

10. The amplifier circuit of claim 8, wherein the feedback loop includes a capacitor coupled between the non-inverting input of the second amplifier and ground.

11. The amplifier circuit of claim 10, including an integrated circuit, the integrated circuit including the first and second amplifiers and the feedback loop.

12. The amplifier circuit of claim 8, wherein the non-inverting input of the transconductance amplifier is configured to receive the output of the first amplifier; and
    wherein the inverting input of the transconductance amplifier is configured to receive the output of the second amplifier.

13. The amplifier circuit of claim 1, including an integrated circuit, the integrated circuit including the first and second amplifiers and the transconductance amplifier.

14. An amplifying method comprising:
    receiving an input signal at a non-inverting input of a first amplifier of an amplifier circuit;
    receiving an output of a second amplifier of the amplifier circuit and the output of the first amplifier at a feedback loop, the feedback loop including a transconductance amplifier configured to receive a differential input voltage and to provide a feedback current;
    providing a feedback signal to the non-inverting input of the second amplifier using the transconductance amplifier; and
    providing a differential output signal at the outputs of the first and second amplifiers.

15. The amplifying method of claim 14, wherein the providing the feedback signal includes to reduce a DC offset error and to increase a dynamic range of the amplifier circuit.

16. The amplifying method of claim 14, wherein the amplifier circuit includes a single-ended to differential amplifier circuit; and
    wherein the input signal includes a single-ended input signal.

17. The amplifying method of claim 14, including receiving a common mode voltage at the non-inverting input of the first amplifier through an input bias network.

18. The amplifying method of claim 14, including:
    coupling an inverting input of the first amplifier to the output of the first amplifier using a first impedance;
    coupling an inverting input of the second amplifier to the output of the second amplifier using a second impedance; and
    coupling the inverting input of the first amplifier to the inverting input of the second amplifier using a third impedance.

19. The amplifying method of claim 14, including:
    receiving the outputs of the first and second amplifiers at first and second inputs of the transconductance amplifier; and
    providing the output of the transconductance amplifier to the non-inverting input of the second amplifier.

20. The amplifying method of claim 14, including:
    coupling a capacitor between the non-inverting input of the second amplifier and ground, wherein the feedback loop includes the capacitor.

21. A single-ended to differential amplifier circuit configured to receive a single-ended input signal and to provide a differential output signal, the amplifier circuit comprising:
    first and second amplifiers, each including an inverting input, a non-inverting input, and an output;
    a feedback loop coupled between the outputs of the first and second amplifiers and the non-inverting input of the second amplifier, the feedback loop including:
    a transconductance amplifier; and
    a capacitor;
    an input bias network; and wherein the non-inverting input of the first amplifier is configured to receive the input signal and to receive a common mode voltage through the input bias network;

wherein the outputs of the first and second amplifiers are configured to provide the differential output signal;

wherein the inverting input of the first amplifier is coupled to the output of the first amplifier through a first impedance;

wherein the inverting input of the second amplifier is coupled to the output of the second amplifier through a second impedance;

wherein the inverting input of the first amplifiers is coupled to the inverting input of the second amplifier through a third impedance;

wherein the feedback loop is configured to receive the outputs from the first and second amplifiers and to provide a feedback signal to the non-inverting input of the second amplifier to reduce a DC offset error and to increase a dynamic range of the single-ended to differential amplifier circuit;

wherein the non-inverting input of the transconductance amplifier is configured to receive the output of the first amplifier;

wherein the inverting input of the transconductance amplifier is configured to receive the output of the second amplifier; and wherein the output of the transconductance amplifier is coupled to the non-inverting input of the second amplifier.

* * * * *